United States Patent [19]

Heller et al.

[11] Patent Number: 4,602,661
[45] Date of Patent: Jul. 29, 1986

[54] APPARATUS AND METHOD FOR FORMING AND TRIMMING THE LEADS OF ELECTRICAL COMPONENTS

[75] Inventors: Martin G. Heller, 68 Harvey Dr., Short Hills, N.J. 07078; Joel Rudder, Rockaway; Stanley J. Olaskowitz, Lake Hopatcong, both of N.J.

[73] Assignee: Martin G. Heller, Short Hills, N.J.

[21] Appl. No.: 559,962

[22] Filed: Dec. 8, 1983

Related U.S. Application Data

[63] Continuation-in-part of Ser. No. 286,009, Jul. 22, 1981, abandoned.

[51] Int. Cl.[4] .............................................. B21F 45/00
[52] U.S. Cl. ...................................... 140/105; 72/452
[58] Field of Search .................. 140/1, 71 R, 105, 140, 140/147; 72/452

[56] References Cited

U.S. PATENT DOCUMENTS

| | | | |
|---|---|---|---|
| 2,877,662 | 3/1959 | Woydt | 74/569 |
| 3,225,797 | 12/1965 | Stoody | 140/147 |
| 3,796,201 | 3/1974 | Golub | 140/105 |
| 3,857,420 | 12/1974 | Newman | 140/105 |
| 3,945,408 | 3/1976 | Halligan | 140/105 |
| 4,020,880 | 5/1977 | Heller et al. | 140/105 |
| 4,166,312 | 9/1979 | Harigane et al. | 140/105 |
| 4,229,964 | 10/1980 | Weresch | 140/105 |
| 4,398,573 | 8/1983 | Kreid | 72/452 |

Primary Examiner—Lowell A. Larson
Attorney, Agent, or Firm—Ralph R. Roberts

[57] ABSTRACT

The invention includes lead forming and trimming apparatus particularly for transistors with a flat side on the body. Such transistors have a plurality of wire leads extending from the bottom of the body. These wire leads are in an alignment and are fed to a guideway between two strips with these strips at a slope sufficient to cause gravitational advancement of the components on their bottom. A finger metering means is provided and is cam actuated so as to cause one finger to be brought in way of the leading wire of a component as the other finger is being withdrawn from in way of a component in the metering station. The die for shaping and trimming consists of two halves moved first toward each other and then away from each other. The die halves are carried by slide supports and are removably mounted on support blocks. The slides are moved by circular cams enclosed in rectangular followers. The die actuating apparatus and slide mechanism is carried on an adjusting lead screw and guide rods so as to provide the exact lead and bend length. The finished component is delivered to an accumulating bin and the trimmed leads are accumulated in another bin for disposal. Resiliency is provided in the guideway to prevent damage of the leads during forming and trimming.

24 Claims, 23 Drawing Figures

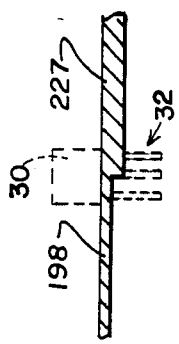
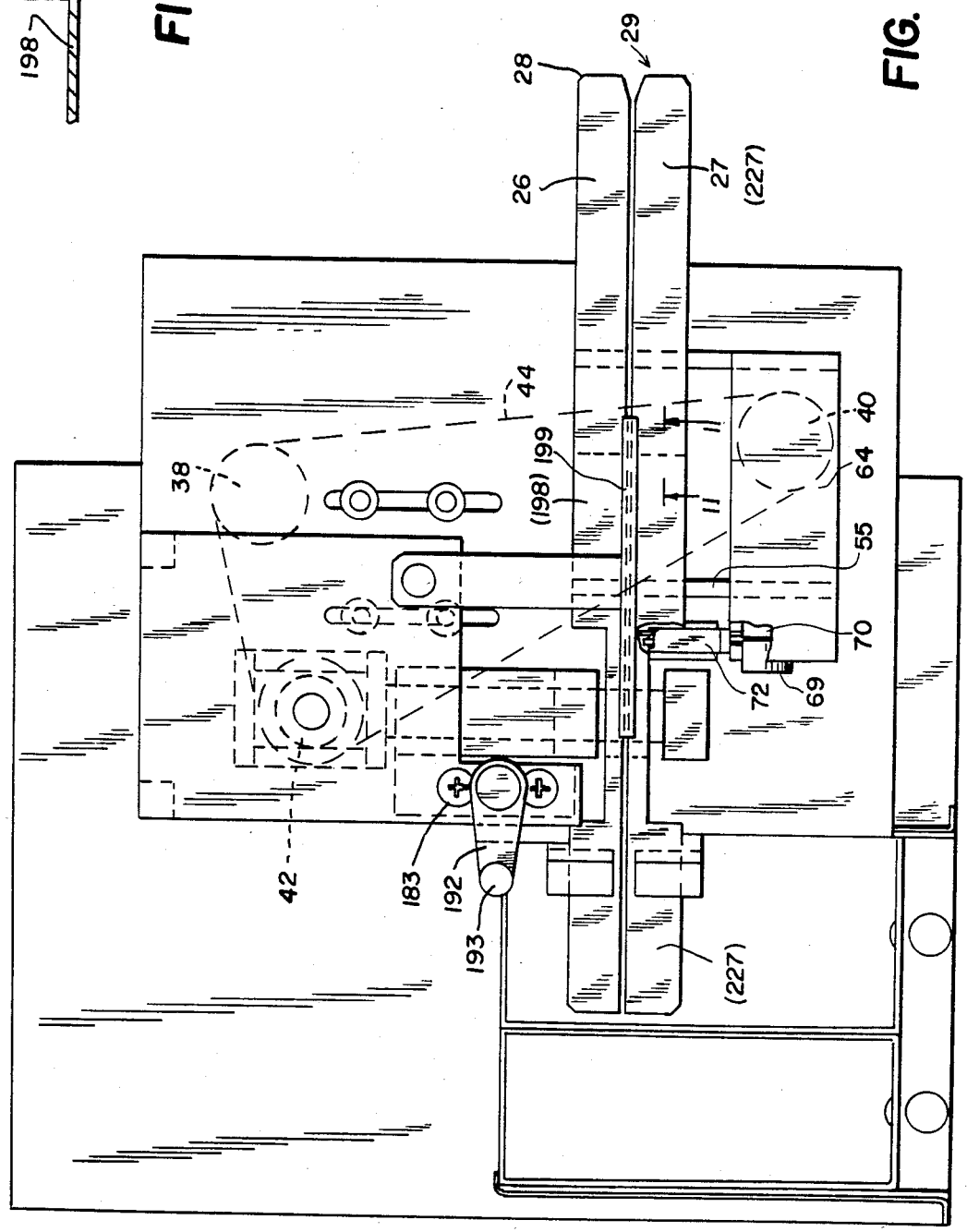

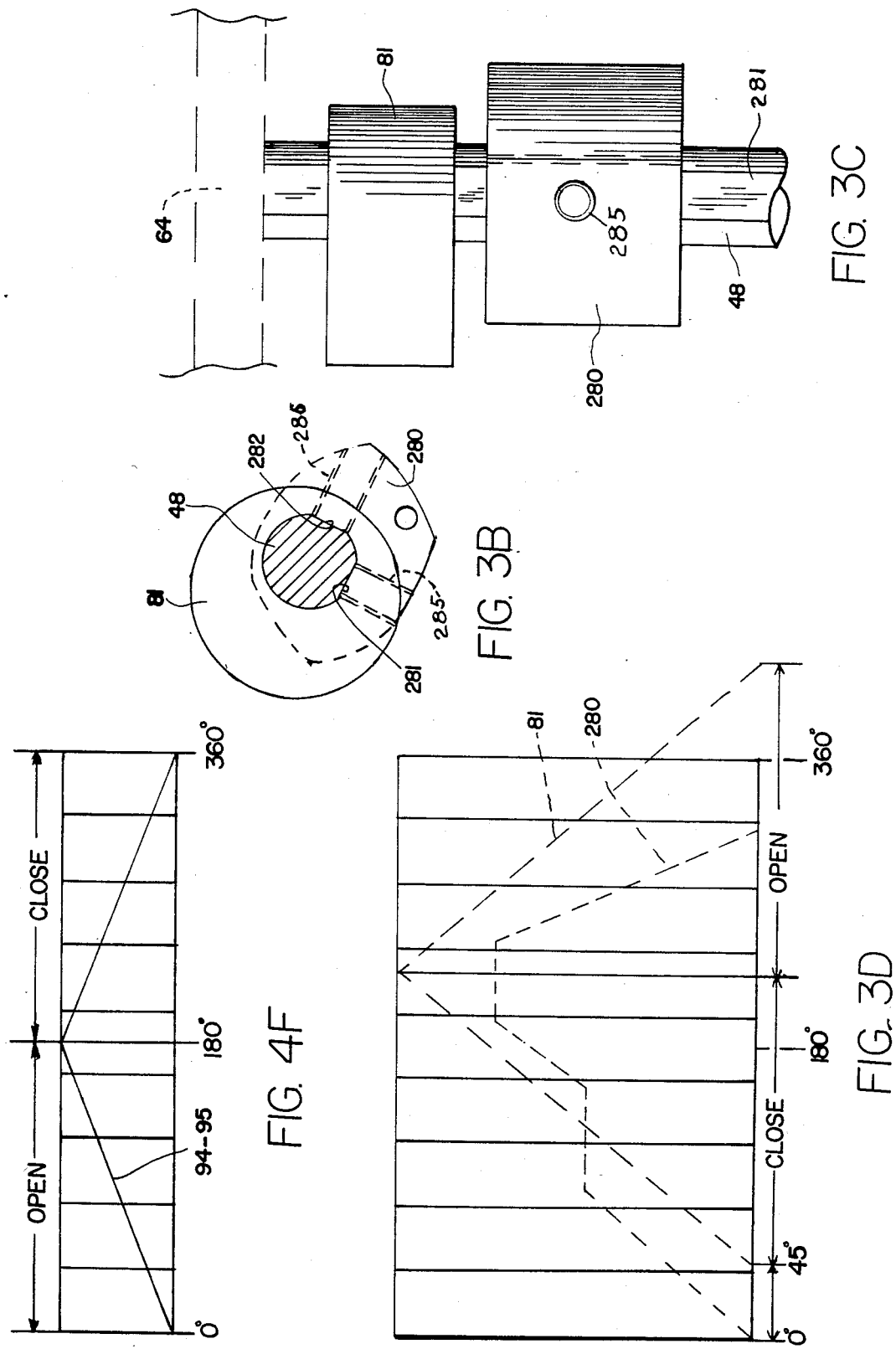

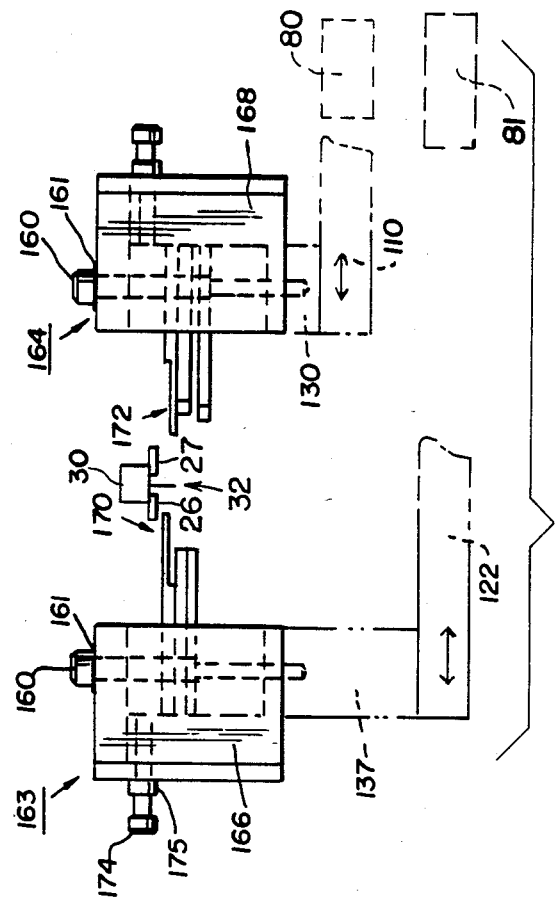
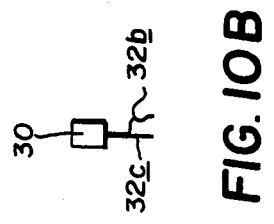
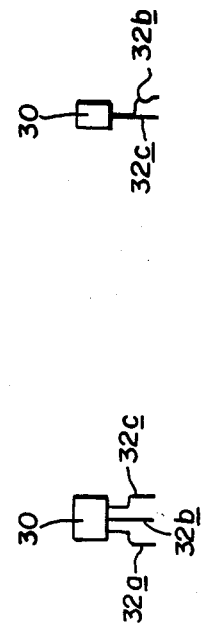
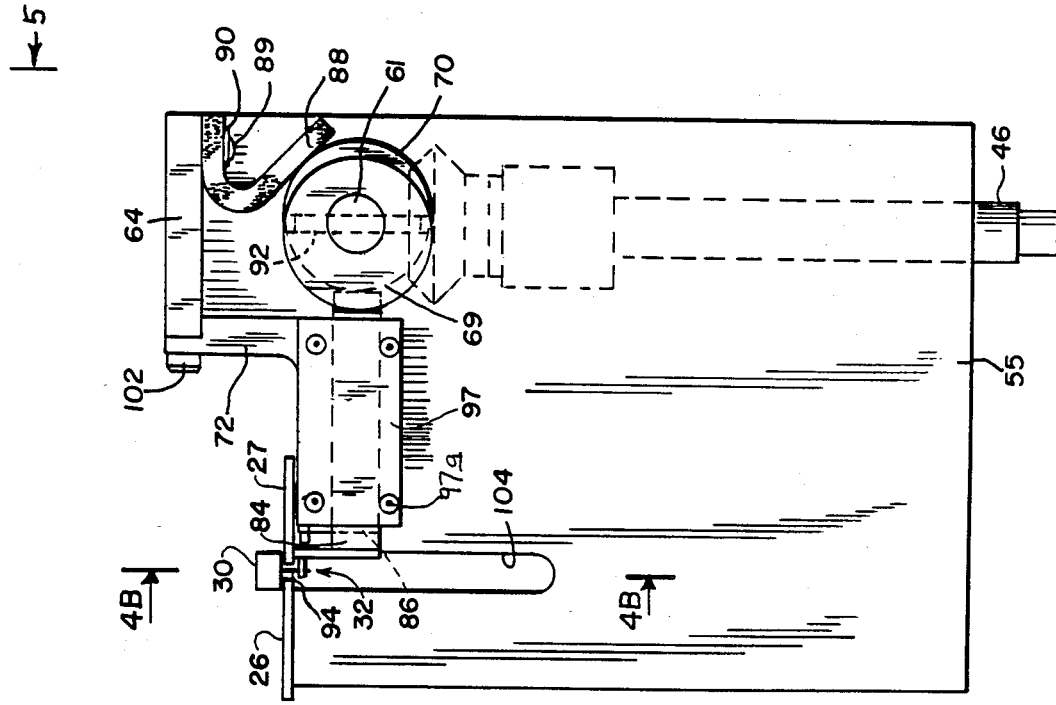

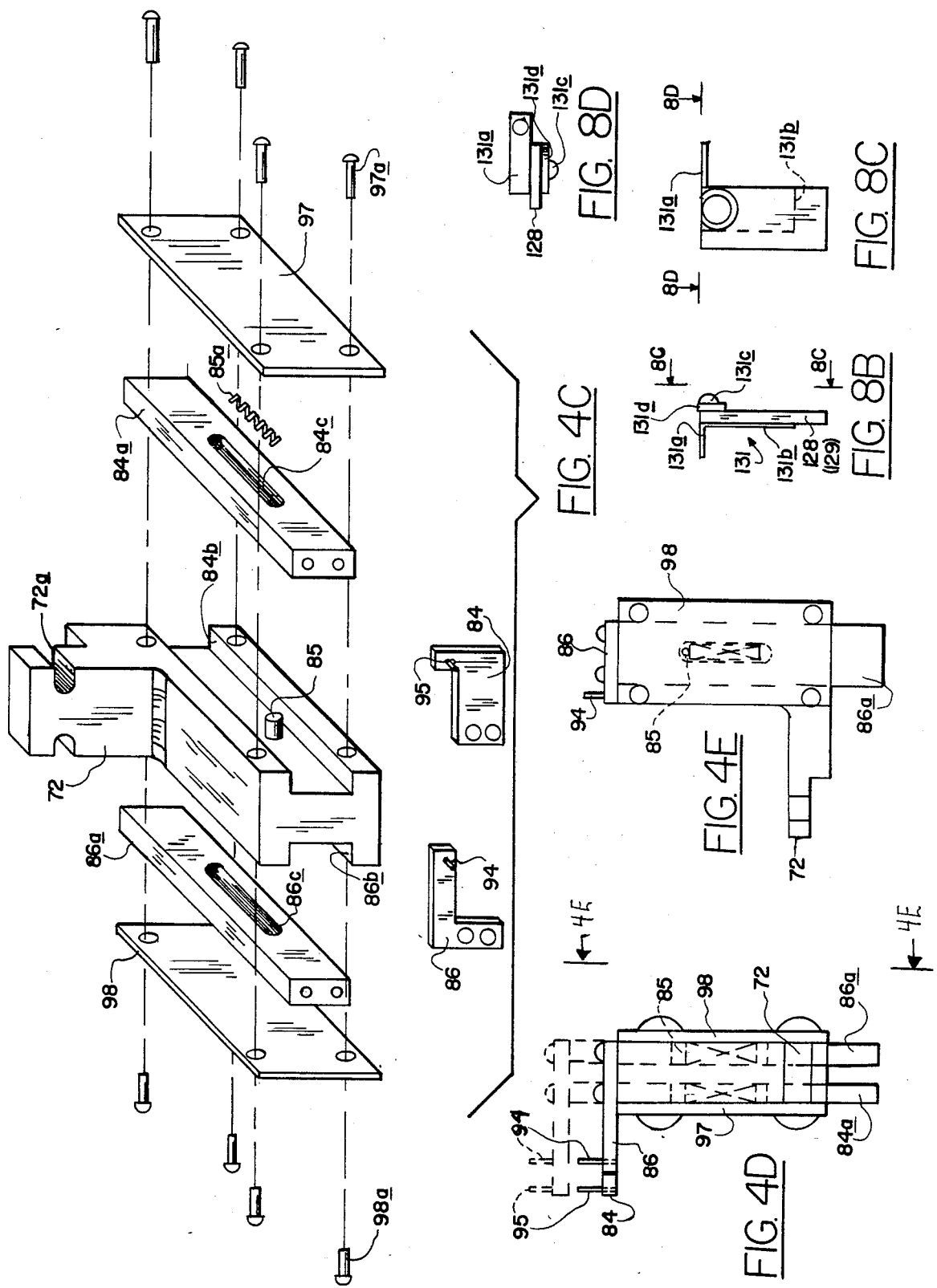

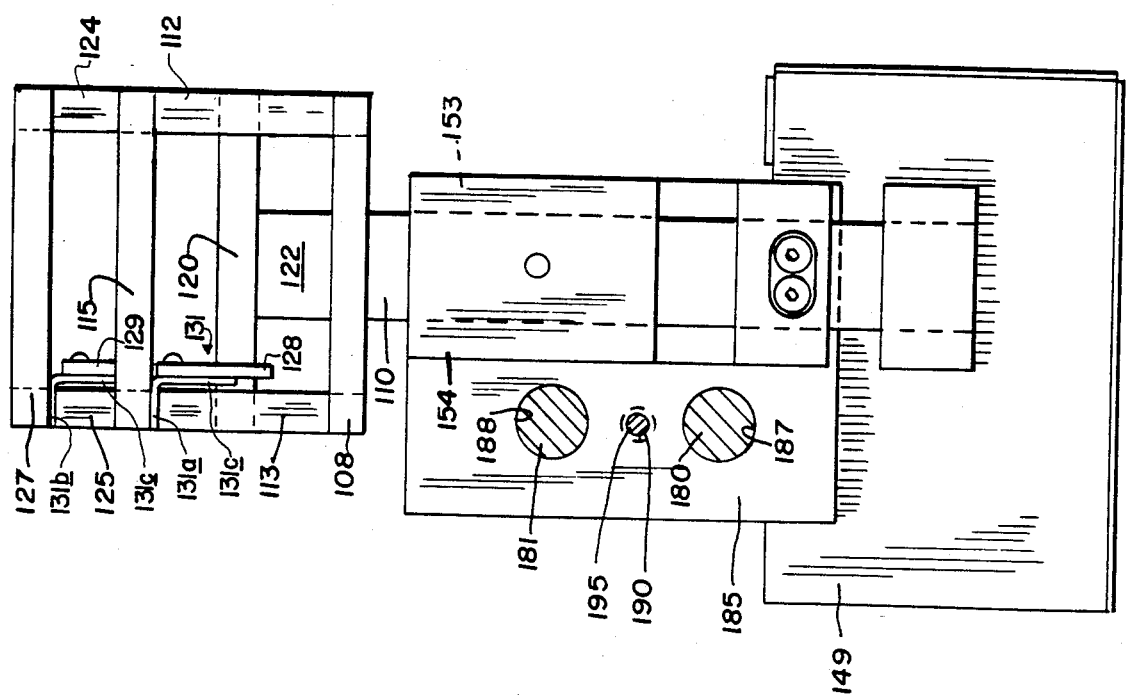
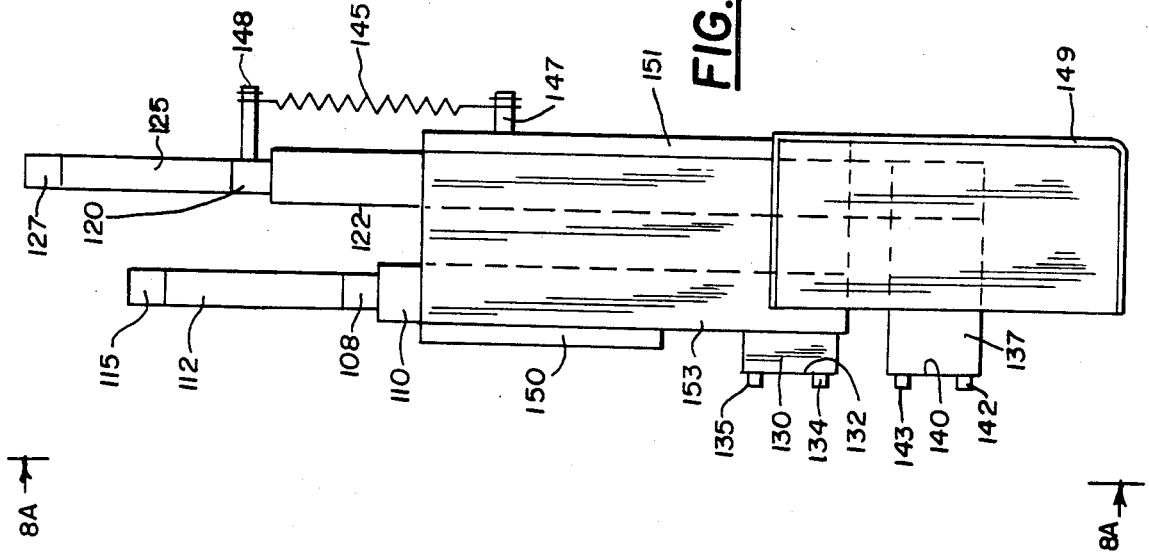

APPARATUS AND METHOD FOR FORMING AND TRIMMING THE LEADS OF ELECTRICAL COMPONENTS

REFERENCE TO RELATED APPLICATION

This application is a continuation-in-part application of U.S. Ser. No. 286,009 as filed July 22, 1981 and with the filing and acceptance of this C-I-P application, U.S. Ser. No. 286,009 including the drawings, specification and claims are expressly abandoned by the assignee of said U.S. Ser. No. 286,009.

BACKGROUND OF THE INVENTION

1. Field of the Invention

With reference to the classification of art as established in and by the United States Patent Office, the present invention is believed to be found in the general class entitled, "Wireworking" (Class 140) and in the subclass therein entitled, "wire cutting and straightening-predetermined length" (subclass 140) and in the subclass entitled "crimping" (subclass 105).

2. Description of the Prior Art

With reference to the prior art, the Applicant has commercially produced for several years apparatus covered by one or more of his United States Patents for shaping and trimming electrical components including integrated circuits. These components have included transistors with two and three wire leads. When his first apparatus was brought to commercial application the material rates of five hundred to fifteen hundred components per hour was considered very acceptable. The apparatus for shaping and cutting the wire leads of the transistor was by a rotary wheel which transported the component and brought the wire leads in way of a die and trimming operation and delivered the components from the wheel to the assembly operator for mounting in an integrated circuit board. In the last few years the emphasis has been on faster apparatus to handle and to receive the circuit components and shape and trim the leads of the components for use in a circuit board. Apparatus for processing such components is exemplified in applicant's U.S. Pat. No. 4,020,880 as issued on May 3, 1977. Another patent which issued just prior to the patent identified above is U.S. Pat. No. 3,945,408 to HALLIGAN as issued on Mar. 23, 1976. In these and other apparatus and patents found in the Patent Office the speeds are slower than required for today's market so the apparatus of applicant's invention has increased speed to process components to more precisely effect shaping and trimming. The apparatus hereinafter described is usable in either a delivered array, such as produced by a hand fed operation or by a vibrating hopper by which the components are fed in an orientating manner to a gravitationally disposed chute or guideway. In the present apparatus it has been found that the gravitationally disposed chute provides a minimum amount of engagement with the component and allows a more-or-less in line, high speed operation.

This apparatus for lead forming and trimming is adapted for both hand feeding and bowl feeding. With hand feeding speeds up to three thousand components per hour may be fed through the gravity track. The bowl feed apparatus feeds up to seventy two hundred components per hour. The all-electric drive is infinitely variable with the die station adapted for removal and replacement of the dies. The processed transistors are disposed or accummulated in a bin or drawer and the scrap lead ends are collected for disposal in another bin or drawer. The apparatus is protected by a cover which is easily removed for repair, maintanence and changes. The apparatus is designed for long maintenance-free life and with electronic feed totalizing and predetermined counting may be made. Usually the components are electrical transistors with plastic bodied and with one side of said body having a performed flat. This permits a form of the leads to be made for insertion in a preselected manner into a printed circuit board. The forming of the leads are a matter of selection and preference.

In the following application the electrical components to be processed for insertion into printed circuit boards include transistors and the like in which the wire leads are disposed in a common plane or line so that the component may be advanced resting on the base of the body and the wire leads extend downwardly in a slot or gap guideway which is of a given width such as thirty-five thousandths of an inch. These electrical components in the description to be hereinafter made are identified as "components".

SUMMARY OF THE INVENTION

This invention may be summarized, at least with reference to its objects.

It is an object of this invention to provide, and it does provide, a gravitational guideway and chute disposed to receive and feed electrical components having a body and wire leads to a spacing gate and then to advance the component to forming and trimming dies and from thence to a discharge accumulation whereat the several components and extending leads which have been like trimmed and shaped are arranged for use in printed circuit boards.

It is a further object of this invention to provide, and it does provide, a gravitational guide and chute for receiving electrical components with wire leads are advanced in a single file array to a gate and spacing mechanism and thence to a shaping and cutting die which is easily removed for replacement on this apparatus. The gravitationally disposed guide and chute of this apparatus may be hand fed from an accumulation or may be delivered from a vibrating hopper.

In brief of this invention may be summarized as a variable speed apparatus (zero to ten thousand or more pieces per hour) which receives electrical components with wire leads and then delivers these components to an angle and gravitationally actuated slide. These components are in a single file array and are spaced by a feeding mechanism and thereafter the components are fed to a shaping and cutting die in which the components are bent to the desired configuration and cut to the desired length after which the now shaped and trimmed components are delivered to an accumulation bin. The apparatus, hereinafter more fully described, includes one electrical motor which has a speed control drive and a timing belt and pulleys. This drive provides for feeding the components on a slide to metering fingers and after a spaced release from these metering finger controls the components are delivered to a shaping and cutting die which is easily removed and replaced in the apparatus.

The apparatus to be hereinafter described in conjunction with the drawings has the slide disposed at an angle of about forty degrees and after forming and trimming the components are discharged into grading and/or storage drawers. The finger control and metering apparatus is cycled by eccentric disks one-hundred-eight degrees out of phase. These fingers alternately stop and release the advanced components into forming and trimming dies. Each die is removably mounted on a slider assembly and also is driven by eccentric means.

In applicant's U.S. Pat. No. 4,020,880, above referenced, the electrical components were identified as "IC" which was applied to components having wire leads and with the plurality of leads extending from a side or end and requiring a guide on which the body is advanced. The present invention is directed to electrical components which have two or more wire leads extending from the bottom of the component which in their movement in and through the guide said leads of the components are aligned.

The slide guide in one embodiment contemplates that the slide strips may employ substantially rigid metal members. These slide guides are used when there is little likelihood of damage to the wire leads extending from the body. In many of the components used the body is of plastic, at least on its exterior. The leads attached and extending from the body are or may be loosened or otherwise damaged with the forming and trimming by the dies. This damage may cause malfunction and so to avoid such damage the slide guide strips are made with a thin portion that extends through the metering and forming stations. This shock absorbing construction reduces, if not totally eliminates, the excessive pull on the lead wires during forming and trimming.

In addition to the above summary the following disclosure is detailed to insure adequacy and aid in understanding of the invention. This disclosure, however, is not intended to cover each new inventive concept no matter how it may later be disguised by variations in form or additions of further improvements. For this reason there has been chosen specific embodiments of apparatus and method for forming and trimming the leads of electrical components as adopted for use for bending and trimming wire leads of components and showing a preferred means for gravitationally feeding such components to this apparatus.

This specific embodiment and an alternate slide guide have been chosen for the purposes of illustration and description as shown in the accompanying drawings wherein:

BRIEF DESCRIPTION OF THE DRAWINGS

FIG. 2 represents a plan view, partly diagrammatic, of the apparatus of FIG. 1, this view taken on the line 2—2 thereof and looking in the direction of the arrows;

FIG. 3B represents a fragmentary plan view showing the cams for reciprocating the dies, this view partly diagrammatic and in enlarged scale with one cam an eccentric disk and the other cam having a contoured periphery;

FIG. 3C represents a side view of the cams of FIG. 3B, this view taken on the line 3B—3B thereof and looking in the direction of the arrows;

FIG. 3D represents a diagram of the timing actuation of the cams of FIG. 3B;

FIG. 4A represents a side view, partly diagrammatic, and showing the finger release drive assembly providing for release of electronic components in a metered and controlled manner for later operations;

FIG. 4C represents in an enlarged scale an exploded isometric view of the components providing the high speed metering of the leads of an IC component;

FIG. 4D represents a plan or top view of the assembled pin metering apparatus of FIG. 4A;

FIG. 4E represents a side view of the apparatus of FIG. 4D, this view taken on the line 4E—4E thereof and looking in the direction of the arrows;

FIG. 4F represents a diagram of the timing cycle of the metering pin apparatus;

FIG. 7 represents a side view, partly diagrammatic, of a die holder assembly and the slide mechanism provided therewith;

FIG. 8A represents a plan or top view, partly diagrammatic, of the die holder and slide apparatus of FIG. 7, this view taken on the line 8A—8A thereof and looking in the direction of the arrows;

FIG. 8B represents a side view of the lubricator used with the eccentric retainers of FIG. 8A;

FIG. 8C represents a face view of the lubricator assembly of FIG. 8B, this view taken on line 8C—8C thereof and looking in the direction of the arrows;

FIG. 8D represents a top view of the spring steel holder and lubricator pad of FIG. 8B, this view taken on the line 8D—8D of FIG. 8C and looking in the direction of the arrows;

FIG. 9 represents a side view of a typical die assembly which provides forming and trimming of the leads of an electrical component with extending wire leads;

FIGS. 10A and 10B represent the forming and shaping of the wire leads of a typical electrical component and using a die set similar to that of FIG. 9, and FIG. 11 represents a fragmentary sectional side view in an enlarged scale of an alternate slide guide construction, this view taken on the line 11—11 of FIG. 2 and looking in the direction of the arrows.

In the following description and in the claims various details are identified by specific means for convenience. These names are intended to be generic in their application. Corresponding reference characters refer to like members throughout the several figures of the drawings.

The drawings accompanying and forming part of this specification disclose details of construction for the purpose of explanation but structural details may be modified and the invention may be incorporated in other structural forms than shown.

Figure 1:
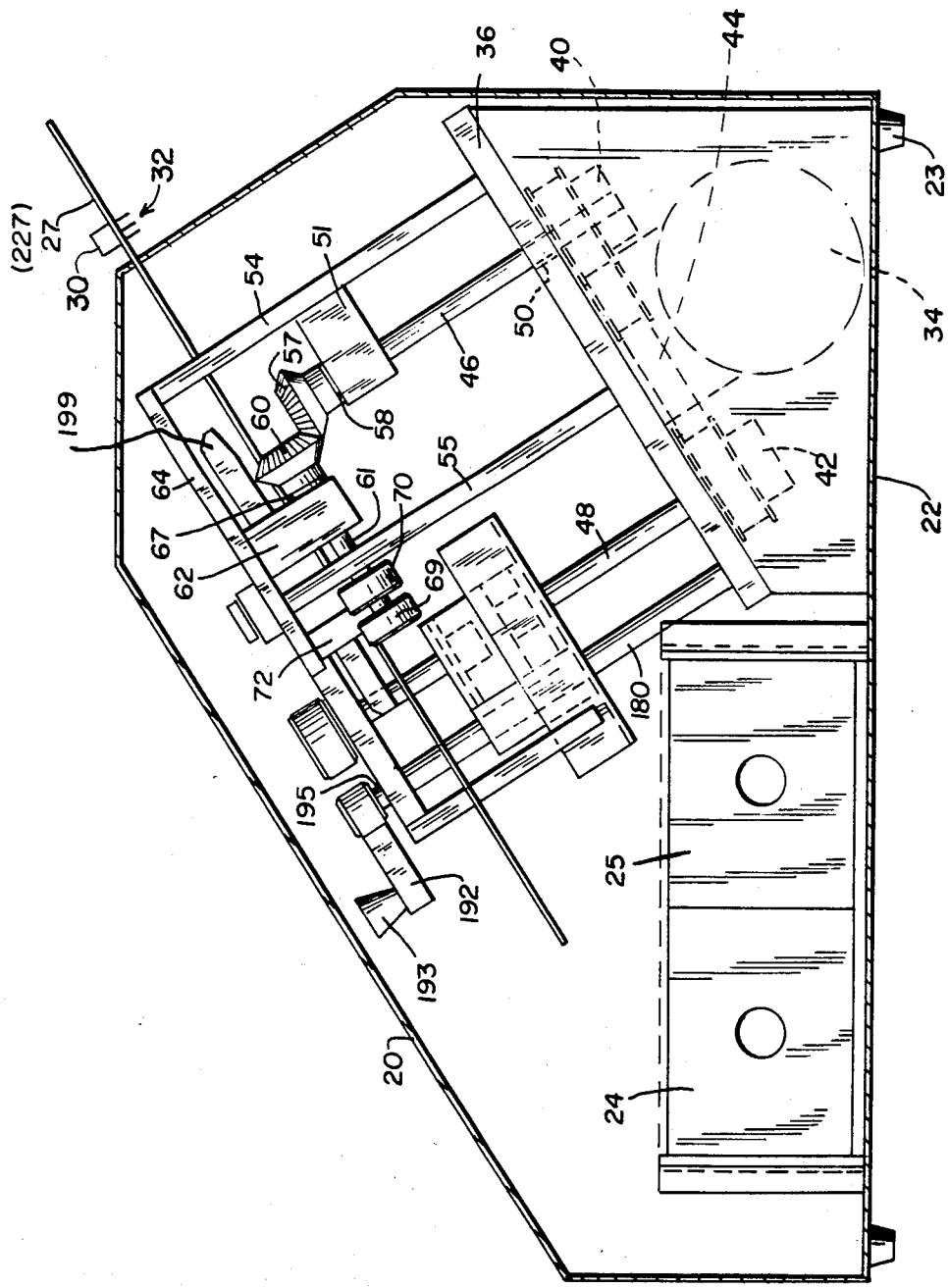
FIG. 1 represents a side view, partly diagrammatic, and showing the general arrangement of the component shaping and trimming apparatus of this invention.

GENERAL ASSEMBLY AS SEEN IN FIGS. 1, 2 and 3

Referring now and next to the drawings, there is shown a preferred arrangement of the apparatus for high speed forming and trimming the leads of electronic transistors. This apparatus has many high speed moving members which are enclosed for many reasons including safety requirements and precautions. A cover or housing 20 is usually removably secured to a base 22 as by screws, snap fasteners and the like. This cover may include end members, and when secured, prevent unwanted exposure of the apparatus or mechanism to exclude dust and possible involvement of a finger or fingers of the attendant. This base 22 is provided with rubber support buttons or feet 23 which permit the ready movement of the apparatus on a table or bench to bring the lead forming apparatus to the desired position.

Also shown are drawers 24 and 25. One of said drawers provides a receptacle for the formed and trimmed component after processing and in the other drawer the trimmed lead remnants are accummulated after processing the component. Particularly in FIGS. 1 and 2 is shown the guideway which includes the two strips 26 and 27 of metal, usually plated with an electroless metal so as to present a smooth supporting surface for the body of a component. The strips 26 and 27 are positioned to provide a guide space of from thirty-two to thirty-five thousandths of an inch. This spacing is usually fixed since the components generally have three lead wires which are in line. So that the strips do not have unwanted sharp corners, the guide strips have their exterior corners beveled at 28 and at the upper input entryway to the guide slot there is a V-shaped entrance 29 to assist the guiding of the leads into the slot.

Figure 3A:
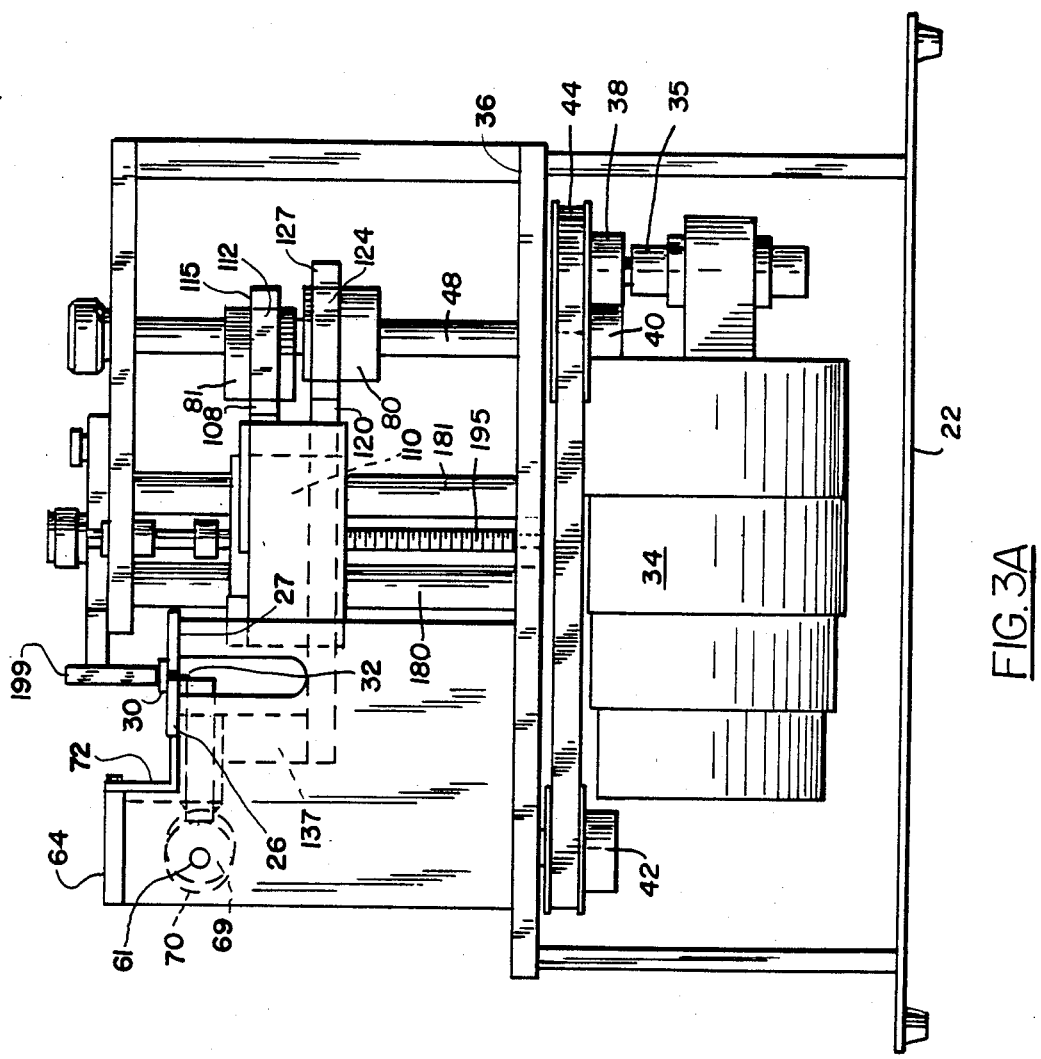
FIG. 3A represents a rear view, partly diagrammatic, and showing the general drive means and arrangement of the apparatus, this view taken on the line 3A—3A of FIG. 1 and looking in the direction of the arrows.
Figure 6:
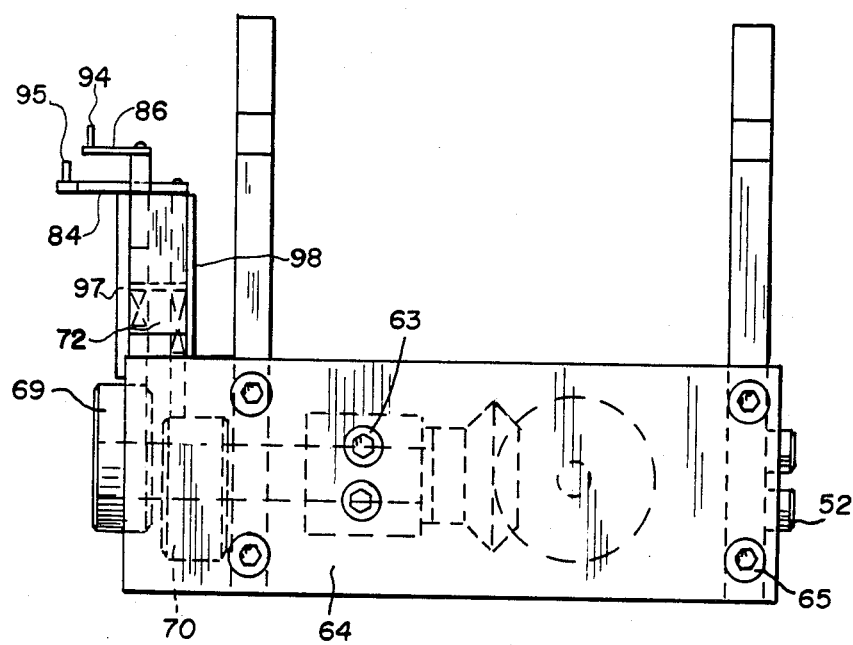
FIG. 6 represents a top view, partly diagrammatic, and showing the finger release drive assembly of FIG. 4A, this view taken on the line 6—6 of FIG. 5 and looking in the direction of the arrows.
Figure 5:
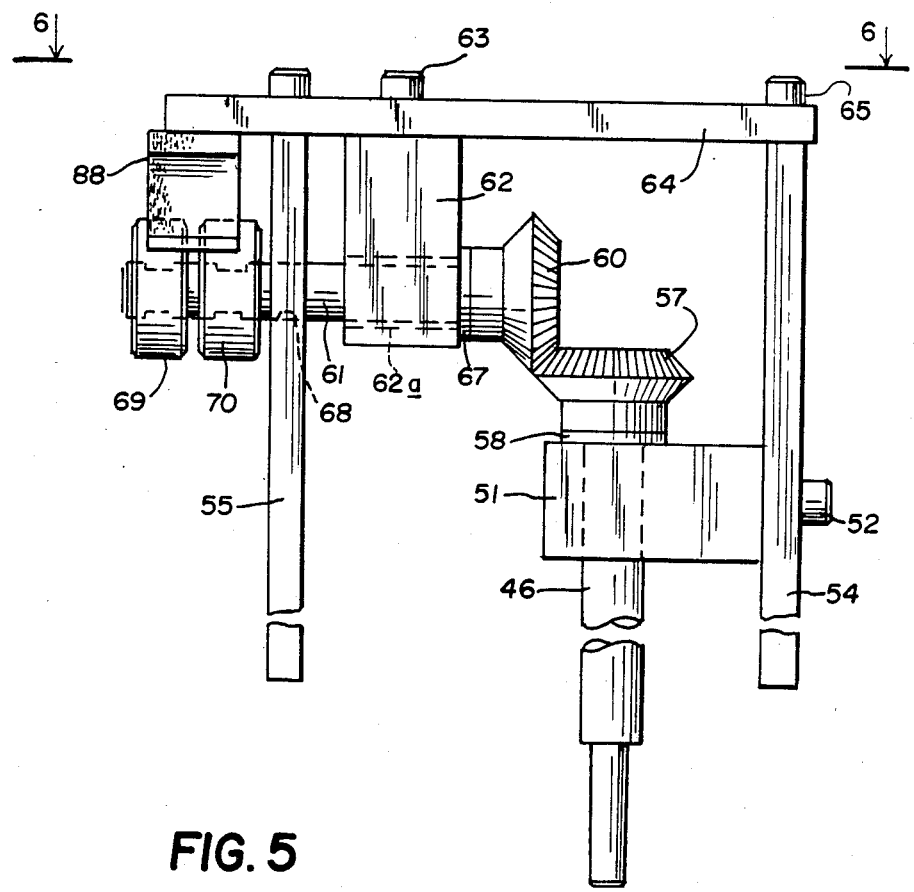
FIG. 5 represents an end view, partly diagrammatic, of the finger release drive assembly of FIG. 4A, this view taken on the line 5—5 thereof and looking in the direction of the arrows.

As seen in FIGS. 10A and 10B, this electrical component identified as 30 has extending wire leads 32a, b and c which are formed and trimmed in operations and apparatus to be later discussed. The apparatus is moved by an electrical motor 34 which is preferably a variable speed motor as shown in FIG. 3 with an output shaft 35 at right angles to the axis of the motor. This motor is carried by a main support plate 36 which is generally parallel to the guideway for the components 30. As seen in FIG. 3A, motor 34 is carried by plate 36 and has a variable speed and the output drive shaft 35 which carries a secured timing belt pulley 38 which also is operationally connected to and turns timing belt pulleys 40 and 42 which are driven by a timing belt 44. These pulleys turn shafts 46 and 48 which are substantially vertical to the support plate 36. Shaft 46 actuates the finger metering apparatus and shaft 48 actuates means for moving the dies for shaping and trimming the leads of the components 30. Shaft 46 is diagrammatically shown in FIGS. 1 and 5 and has its lower end carried in a bearing 50 in plate 36 and above this plate is supported in and by a pedestal 51 which includes a bearing means not shown. This pedestal is secured as by cap screws 52 passing through apertures formed in support side plate 54. A like support side plate 55 is also provided and seen in both FIGS. 1 and 5.

Shaft 46 (FIG. 5) carries at its upper end a bevel gear 57 and immediately below the hub of this gear and providing an antifriction support for said gear is a washer 58. The bevel gear 57 meshes with and turns a like bevel gear 60 carried by a short shaft 61. A pedestal 62 and having a journal 62a therein is secured by cap screws 63 to a bridge plate 64. This bridge plate is secured by cap screws 65 to side plates 54 and 55. The lower ends of these side plates are secured to the main support plate 36 by cap screws not shown.

The bevel gear 60, as it is turned, is prevented from engagement with the face of pedestal 62 by means of a bearing washer 67 which is like washer 58 and is interposed between the hub of gear 60 and the face of pedestal 62. An aperture 68 is provided in plate 55 so that the short shaft 61 may pass therethrough and on its leftward end is secured disk-like cams 69 and 70 which are circular cams and are one-hundred-eighty degrees out-of-phase with each other. A support block 72 is shown as attached to the extending end of bridge plate 64 and carries finger mechanism which is discussed in detail hereinafter.

Also shown in FIG. 1 is shaft 48 which is rotated by the secured timing belt pulley 42 as it is moved by the motion of the belt 44. This shaft is also shown in FIG. 3 in which it is diagrammatically depicted as carrying two cams 80 and 81. These cams are disk-like members which engage and move the die shaping and trimming apparatus of FIG. 9. The dies are moved by the apparatus of FIGS. 7 and 8A to be hereinafter more fully described. These disk-like cams are secured to shaft 48 so that as the shaft is rotated the cams are eccentric and provide one-hundred-eighty degrees out-of-phase motion so that the dies are either at extreme and opposite extents or approach each other and are at the inner extremes of motion.

In FIGS. 3B and 3C it is to be noted that often the die shaping and/or trimming requires cam actuations that are not symmetrical. As seen in FIGS. 3B and 3C cam 81 provides eccentric motion with a circular configuration. The resulting motion of the die control is a regular in and out motion. The other cam is identified as 280 and as seen in FIG. 3B has an irregular contour providing a pause motion in the actuation of the dies of FIG. 9 and others. Shaft 48 is provided or formed with two flats 28 and 28 by which the cams are positively positioned and retained on the shaft 48. It is to be contemplated that set screws 285 and 286 will be used to secure the cams in place on said shaft. Flats are provided so that removal and replacement of said cams may be achieved without deformation of the shaft diameter.

In FIG. 3D there is diagrammatically shown the timing diagram of the actuation of the cams 81 and 280 for a full rotation of shaft 48. As shown, cam 81 provides a constant reciprocated motion as in the diagram. The cam 280 has three periods of dwell and this cam is out-of-phase as shown and is only for the cam depicted. Other configurations can and are provided to accommodate different requirements.

Figure 4B:
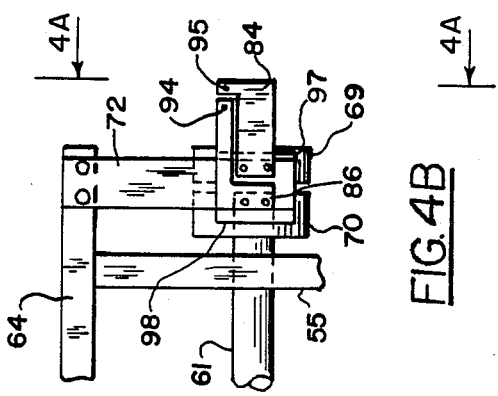
FIG. 4B represents a fragmentary view in a slightly enlarged scale and showing the arrangement of the metering apparatus and the pins by which the lead wires of a transistor are alternately engaged and disengaged to provide a controlled feeding of the transistors one-at-a-time to forming and/or trimming dies, this view taken on the line 4B—4B of FIG. 4A and looking in the direction of the arrows.

The dies of FIG. 9 are removably mounted on the apparatus of FIGS. 7 and 8A. As above noted, the shaft 46 is moved in a timed relationship and rotated by the advance of the timing belt 44. The bevel gears 57 and 60 cause short shaft 61 to be rotated at the same speed as the shaft 46. The cams 69 and 70 are rotated as this short shaft 61 is rotated. Cam 69 engages and moves a finger slide portion member 84a and the other cam 70 engages and moves finger slide portion member 86a to its limit of movement. As seen in FIGS. 4A through 4F and 6, the cams 69 and 70 are secured to shaft 61 and to provide an eccentric surface and action so that as the shaft is rotated the peripheral surface of each cam is wiped and/or oiled by a wiper 88 secured by screws 89 and washers 90 to bridge plate 64. The cams 69 and 70 are secured to short shaft 61 by pins 92 shown in phantom outline in FIG. 4A, but other securing means may be provided. Release members 94 and 95 (FIGS. 4A through 4F and 6) are carried by finger slide plate members 84 and 86 and are retained in side-by-side slideable condition and position by side plates 97 and 98. In FIG. 4, the side plate 97 is shown retained by flat head Phillips slotted cap screws 97a. As an assembly, the finger metering apparatus is secured to and is carried by a block 72 which is retained in a fixed position on an end of bridge plate 64 by cap screws 102. As depicted, the finger release members 94 and 95 are about three-sixteenths of an inch apart. This spacing is only symbolic as the spacing between release members 94 and 95 is made to suit the transistor being processed. The inline transistors 30 usually are in a selected capacity but leads with overall spacing lesser than three-sixteenths of an inch are known and there are transistors having in-line leads occupying as much as three eights of an inch spacing so the members 94 and 95 are spaced as required. As the transistors 30 are gravitationally fed along the guideway members 26 and 27 the body of the transistor 30 is above or on top of the guideway members and the leads and finger release members 94 and 95 are immediately below the guideway members. Each finger is cycled back and forth in way of the advance of the leads of the component. The first finger 94 comes in way of the advancing leads of the component and inhibits further progress until the cam 70 is rotated sufficiently for the leads of the component to pass the moving and withdrawing finger 94. The withdrawal of the finger 94 allows the component to proceed downwardly in the slot until the wire leads come in way of the inwardly moving finger 95 as advanced by the cam 69. The alternate cycling of the finger portions 94 and 95 provide the stop and go release and feed of the components to the later die actuation. Both side plate 54 seen in FIG. 1 and the side plate 55 are formed with a slot 104 which allows the wire leads of the components to pass through without engagement.

FINGER RELEASE MECHANISM OF FIGS. 4A-4F

The gravitationally advanced components are metered by finger release members actuated by eccentric cams 69 and 70. As seen in FIGS. 4A through 4E and also in FIGS. 1, 2, 3 and 6 this finger release apparatus alternately engages and releases the wire leads of components as they are gravitationally advanced along the guideway. The components, after metering, are released to later shaping and trimming operations by die means as in FIG. 9.

The block 72 is mounted by screws 102 to bridge member 64 and when assembled provides metering apparatus. As seen in FIGS. 4C, 4D and 4E, this apparatus includes the support block 72 in which slide portion members 84a and 86a are alternately cycled back and forth by eccentric cams 69 and 70. Pins 94 and 95 are moved by these cams into and from the path of the leads 32 of the transistor 30. Plate 84 and pin 95 are moved by cam 69 which moves finger slide 84a. Plate 86 and pin 94 are moved by cam 70 which moves finger slide 86a. The plates carrying pins 94 and 95 are contoured to nest side-by-side (FIG. 4B) and pass each other without interference. The pins and plates carrying them are replaceable and repairable as desired. The leads 32 and body of the transistor 30 determine the spacing between pin 94 and pin 95. Spring means 85a is provided for moving the finger slide portions 84a and 86a toward the cams 69 and 70. These cams are shown as disk-like members but other means may be provided including anti-friction (ball bearing) eccentrics. The cam engaging end of finger slide portion members may be contoured or transversely cut off.

In FIG. 4B is shown the relationship of the pins 94 and 95 as carried on plates (ends of slides) 86 and 84. These plates are removably attached to the associated slide members 86a and 84a. In FIGS. 4C, 4D and 4E is shown the several members that provide the high speed metering mechanism. The support block 72 is more-or-less a right angle support member. The upstanding portion as seen in FIG. 4C shows cutouts 72a for the retention thereof by screws 102 to bridge plate 64. Finger slide 84a slideable and is reciprocated in groove 84b formed in the side of block 72. A dowel 85 is mounted in an aperture in block 72 and extends into the groove 84b. A through slot 84c is formed in slide 84a conventionally by an end mill and the dowel 85 extends substantially through this slot. A compression spring 85a is placed within the slot 84c and engages the front end of spring 85a to provide a determined bias to urge finger slide 84a rearwardly or to the position of FIGS. 4D and 4E. This dowel pin 85 not only engages the spring 85a but also provides a limiting stop to the cycled movement of the finger slide 84a.

A cover plate 97 is attached by cap screws 97a to block 72 which is provided with threaded holes. End plates 84 is removably attached to finger slide 84a by cap screws not identified but shown in FIGS. 4D and 4E. Dowel 85 extends a like distance leftward into groove 86b and a like spring 85a is provided for a finger slide 86a which is reciprocably moved in groove 86b formed in support block 72. A cover plate 98 is secured in place by cap screws 98a whose threaded shanks enter into threaded holes in the support block 72. End plate 86 is attached by cap screws not identified as indicated in FIGS. 4D and 4E.

In FIGS. 4D and 4E the relationship of the several components of FIG. 4C is shown in an assembled condition. When support block 72 is in an unattached condition the finger slides 84a and 86a are urged to the rearward position by springs 85a and the cams 69 and 70 of FIG. 4A position the finger and end plates as these cams are rotated. In the timing diagram of FIG. 4F it is to be noted the fingers 95 and 94 move in and out in a regular pattern and provide the desired open and close condition.

DIE ACTUATION APPARATUS AS IN FIGS. 8A-8D

When the component 30 has been released to bending and trimming, the dies of FIG. 9 are employed. FIGS. 1, 2 and 3A show the preferred apparatus and positioning and in FIGS. 8A and 9 the reciprocable and guided die apparatus is shown in a larger scale and with amplified detail. Cams 80 and 81 actuate the two cam engaging and retaining members. As shown in both a side and plan view, an upper reciprocable member is actuated by the upper cam 81 which is enclosed and actuates the upper assembly which includes a front transverse member 108. This transverse member is disposed and secured at its midlength to a slide and die support 110. This is the short support moved by the upper cam 81. To complete the rectangular cam enclosure the member 108 has secured at its ends side members 112 and 113 and at their distal ends is secured another transverse member 115. This rectangular retaining assembly and its attachment to die support 110 is by cap screws and/or the like, not shown. This rectangular box assembly is easily taken apart and reassembled for repair, replacement and the like and permits cam 81 and shaft 48 to be positioned before assembly of the rectangular configuration. This rectangular configuration and retaining means allows side-to-side movement of the circular cam 81 while confining the cam and enforcing a back and forward movement of the slide support 110. As shown, the cam 81 and also cam 80 are the preferred embodiment and are solid disk-like members, but this does not preclude the use of an anti-friction bearing on the shaft to act as a cam. Other cam forms may be provided but the disk-like configuration is believed to be the most economical and the throw of the cams can be easily changed by substituting the cam offset.

As in FIGS. 8A and 9, the lower cam 80 moves the far die half. This assembly, like that above described, includes a front transverse member 120 which is attached at its midpoint to lower slide and die support 122. Side members 125 and 124 are attached at their ends to member 120 and at their outer or other ends to outer transverse member 127. As above, the rotation of the disk-like cam 80 moves the reciprocated and guided die assembly and in particular support 122. This box-like assembly is rectangular and is easily taken apart and/or reassembled. Cam 80 moves in this enclosure and side-to-side movement produces no forward and back movement. The peripheries of the cams 80 and 81 in this embodiment are lubricated by oil carried by felt pads 128 and 129 which are carried to the right and inner surfaces of side members 113 and 125 respectively. In FIGS. 8B, C and 8D there is depicted a right angle spring holder identified as 131 and having two apertures therein. One aperture is shown in each view. The short leg 131a is contemplated to be secured between member 115 and 113 when the assembly of the enclosure is to be made. A like short leg 131a is secured between members 125 and 127 when assembly of the enclosure for cam 80 or 280 is made. The other leg 131b of this holder is longer and is adapted to hold and retain like wiper pads either 128 or 129. These longer leg portions identified as 131b are illustrated with the felt pad secured by a rivet and a washer 131c and 131d. Means other than rivets and washers may be employed but it is to be noted that the wiper material is spring-biased into a light and controlled engagement of the periphery of the rotated cam and this oil saturated pad insures lubrication of the inner surfaces of 108, 115, 120 and 127. The wiper material acts similarly to or is like wiper 88 seen in FIGS. 4A and 5. This is not to preclude other means of reducing friction but it is to be realized that the die forming means are moved to accommodate the lead wire formations desired.

Referring particularly to FIG. 7, it is to be noted that the upper reciprocated member 110 carries on its inner or die supporting end a support block 130 which has projecting upwardly from its upper support surface 132 a pair of locating pins 134 and 135. The lower reciprocated member and support 122 is actuated by cam 80 (or 280 FIG. 3B) and carries and moves support block 137. This block, which is secured to the distal and outer end of reciprocated member 122, has a support surface 140 which is shown as in coincidence or the same plane as support surface 132. Also projecting upwardly from this surface are locating pins 142 and 143 which provide positive positioning as established by the die halves described hereinafter in FIG. 9. These support surfaces 132 and 140 are shown as in the same plane for ease of mounting and maintaining the die halves.

Also depicted is a spring 145 which has one end secured to a support pin or post 147. The other end of this spring is secured to and supported by a pin or post 148 secured in a hole formed in transverse member 120. This spring 145 insures that the die half carried on support blcok 137 is moved toward an open condition and the cam 80 or 280 and spring moves the die half outwardly from a possible closed condition. This spring is provided only as insurance. Normally it does not come into play. Shown in diagrammatic outline in FIGS. 7 and 8A is tray 149 that is disposed to receive the trimmed lead wires from the components. Slide members 110 and 122 are reciprocable and retained by upper and lower retaining plates 150 and 151 respectively and the same slides are retained by side plates 153 and 154. A spacer means between members 110 and 122 is not shown or identified.

Other slide control means may be provided but the depicted apparatus and rectangular cam follower apparatus insures positive control of the die movement. Eccentric cams, with and without spring followers, may be employed. Anti-friction commercial eccentrics with connected Pitman arms may also be used but the preferred arrangement shown provides high speed efficiency.

EMBODIMENT OF FIGS. 9, 10A AND 10B

Referring next and now to the drawings and FIGS. 9, 10A and 10B, it is to be noted that the lead former apparatus is particularly adapted for transistors and for those with flats on their side. These transistors are fed with their wire leads extending downwardly, gravitationally through the finger spacing mechanism of FIGS. 4A through 4F, 5 and 6 to the die forming and trimming operation of FIGS. 7 and 8A through 8E. As seen in FIG. 9, on the extending slide support members 110 and 122 are secured the support blocks 130 and 137. Cap screws 160 with washers 161 pass underneath the head through the die block bodies and secure the dies so that each component 30 and its lead wires 32a, b and c are shaped and cut to length. As seen in FIG. 1 and in FIGS. 7 and 8A, an accumulator tray or bin 149 is disposed so as to catch the trimmed leads of the components and by gravity said unwanted lead portions are fed to the bin or drawer 25 for emptying in the usual manner.

As seen in FIGS. 7 and 8, the dies are mounted on positioning pins 134, 135, 142 and 143 and are secured to supports by means of cap screws 160. As seen in the typical die assembly of FIG. 9, the left and right hand die members generally identified as 163 and 164 include forming and cutting blades that are sharpened when dull and are made particularly for a selected configuration. Left and right hand blocks 166 and 168 respectively are substantially alike and retain the die members 170 and 172. Adjusting screws 174 and cap screws 175 are provided for assembly of the dies in a conventional manner. The die forms are made to suit the requirement for the length of the leads of the component and the configuration desired. In FIGS. 10A and 10B the leads 32a, b and c of component 30 are depicted in a selected configuration but this is only suggestive and the final configuration is dependent on the customer's requirement.

In FIG. 9 the component's wire leads are shaped and trimmed by the die halves. These wire leads 32a, b and c are depicted in FIG. 10B and the leads are shaped and trimmed to suit a particular circuit board so the dies are and must be mounted and mountable on the support blocks 137 and 130. On these blocks the die halves are positioned on the pins 134, 135, 142 and 143 and are secured in place by cap screws 160. Each die half 163 and 164 includes shaping and trimming dies to accommodate the desired configuration of the leads. Generally there is both forming and trimming but each class of components requires a special configuration. As viewed, the die 170 is on the far side of the guideway plates 26 and 27 seen in phantom outline. The leads 32 of transistor 30 are trimmed and shaped to accommodate the placing of these leads in appropriately positioned holes in a P.C. board not shown. Die 170 is reciprocated by cam 81 and the right die 172 is reciprocably moved by cam 80 as above described.

The above apparatus as depicted has an all-electric drive with an adjustable die station. The finger release station insures that the leads of the transistors or components are processed with the minimum abuse to the transistor and/or leads. The drawers or bins 24 and 25 are adapted to collect processed components in bin 24 (forward) and the other bin 25 (rearward) collects or accumulates the scrap lead wires removed by the dies. The cover is easily removed and replaced to permit the mechanic or attendant to inspect or adjust the mechanism. The components may be fed by hand or from a vibrated feeder bowl. Conventional totalizing and electrical counting, both for a predetermined number and other combinations, are easily provided.

It is to be observed and noted that in FIGS. 1, 2 and 3A and FIG. 8A provision is made for moving the slider die apparatus and the dies of FIG. 9 mounted thereon toward and away from the slide strips 26 and 27. This adjustment allows and permits the forming and trimming die halves to be adjusted up and/or down to lengthen or shorten the lead length under or adjacent the body of the component 30. The slider die apparatus is carried on two smooth rods or shafts 180 and 181. The ends of these shafts are secured by cap screws (flat head) 183 seen in FIG. 2. The lower ends of these rods are secured also by screws to the support plate 36. In an extending portion 185 of the slider die apparatus there are formed two precise bores 187 and 188 for the passage of these rods or shafts with one rod 180 or 181 in each bore as seen in FIG. 8A. These bores may have bearing means or otherwise provide guide and positioning means. Between these bores 187 and 188 is a threaded through hole 190. As reduced-to-practice, this threaded hole is a quarter inch acme thread for a like lead screw carried therein. As seen in FIG. 8A, the accumulation tray is secured to support member 122 and is movable up and down as the dies are moved. The die halves 163 and 164 as seen in FIG. 9 are reciprocated.

In FIGS. 1 and 2 is seen a crank arm 192 and knob 193 that rotates lead screw 195 seen in side elevation in FIG. 3A and which engages the threaded hole 190 shown in FIG. 8A to move the slider dies shown in FIG. 9 up and down to the desired position. This slider die, a manually controlled moving means, which may or may not have an auxiliary lock to retain the assembly in the position that it has been moved. The knob 193 and crank arm 192 are freely rotatable above cap screws 183 and indicator means may be provided if and when desired. This adjustability capacity provides versatility in the use of the apparatus above described.

ALTERNATE SLIDE CONSTRUCTION OF FIG. 11

Referring to the fragmentary view of FIG. 11, it is to be noted that the wire leads 32 extending from the body 30 may and do get damaged when pulled to the extent that the component malfunctions. The wire leads and their electrically connected properties are subject to damage, potential or actual, so the slide guide is made with a shock absorbing section. As seen in FIG. 11, the slide strip 227 forms and provides the inlet portion and the exit portion and is of a chrom plated steel having a thickness which is relatively rigid. The steel with chrome plating is to prevent rust and wear and the plating further promotes lubricity of the component body as it slides along the strips. The portion of the guide, in which the right end identified as 227 and as seen in FIG. 2 is of such a thickness. A much thinner intermediate portion identified as 198 is immediately to the left of portion 227. This thinner portion is planar with the top surface of the stiffer slide strip portion 227 and has no appreciable space therebetween. In practice, this thinner portion is about twenty to twenty-five thousandths of an inch in thickness giving to the slide guide a shock absorbing potential when the component body is brought to the forming and trimming operation and the dies are actuated. This slide guide, as shown in planar outline in FIG. 2, is as in the description of FIG. 2, but to show the thinner portion said thinner portion is shown with phantom terminations. These terminating identifications are only symbolic since portion changes may be made to suit the designer's desires. It is only necessary that the thinner transport strips be used where and when the die engages the wire leads for forming and trimming.

It is also to be noted that a slide hold-down member 199 is seen in FIGS. 1 and 2. This hold-down member is disposed to engage the top surface of a component body 30 as it is advanced to prevent the body from unwanted upward movement. It is to be noted that the right end of this guide and hold-down is tapered upwardly to guide the advancing body and maintain said body on the slide strips.

The side members 54 and 55 are conventionally of metal and as shown are of equal length so that the slide strips 26 and 27 may be secured thereto at the desired slope. These side members 54 and 55 are fastened to support plat 36 as by cap screws into threaded holes in the ends of said plates. It is to be noted that the component bodies 30 have their leads interior of the edges so that a small space or distance is provided between the leading lead and the trailing lead when the components are aligned and are adjacent in the slot of the slide guide. The fingers 94 and 95 are made sufficiently thin so that the first finger 94 (upper) is brought in way of the leading lead of the above component while the second finger 95 (lower) engages the leading edge of the lead wire of that component in the metering device. As the lower finger is withdrawn to allow escape and further progress of the component the next above component is metered and advanced. This first upper finger comes in way of the leads of the above component to inhibit the progress of this component until withdrawn. These fingers are reciprocated at a selected speed by the cams and so that the metering is in timed relationship to the desired processing. The release of the component by the lower second finger causes the released component to move into the form and trim die for processing. Cams are shown as the simplest and most positive means for translating rotary motion into linear motion. The book "CAMS" by Harold A. Rothbart shows and discusses the many types of cams including both closed paths and open follower types. The shaped cam, with or without a groove, may be used but the simple radial cam using circular disk members requires the least expense and the follower is easily constructed. The single disk and yoke cam used with the die of FIG. 9 allows the up and down adjustment of the dies while maintaining the actuation and forming and trimming desired.

As a method the above apparatus provides the steps for processing the leads of electrical components having like bodies and a plurality of wire leads extending from the base of the component, the method including feeding electrical components such as transistors having like bodies and wire leads extending from the base of said components, said leads being aligned in a row, the method including the steps of providing a base and frame for the apparatus; carrying an infinitely variable speed motor with the output shaft thereof carrying a sprocket by which a flexible drive means is advanced; positioning a narrow slot-type guideway through which the lead wires of the components extend, said guideway including two slide members disposed at a slop of about forty degrees and providing a gravitationally actuated means for advancing the components on the bottom of their bodies; placing a metering station in way of the guideway and reciprocating first and second fingers in and out of said guideway and with said fingers having a movement of one-hundred-eighty degrees out of phase with each other so that while the second finger is in way of the leading edge of the wire lead for that component in the metering station the first finger is positioned to enter the guideway above the trailing wire lead of that component in the metering station and as this second finger is moved into the guideway to engage the leading wire lead of the immediately above component not yet in the metering station the second finger inhibits the advancement of this component while that component in the metering station is released by the first finger, said first and second fingers being alternately cycled to first inhibit then release a component for advancement on the slide members; carrying a shaft on the base and frame and rotating the shaft by said motor through a flexible drive means, said shaft carrying cams disposed to move the first and second fingers with an in and out movement and in an out of phase condition; retaining and carrying the fingers on slide members moved by the cams, said cams carried on the rotated shaft actuating the fingers; removably mounting die halves on slide mechanism carried by the frame and base and moving said slide mechanism by cams carried on a shaft driven by the motor, said shaft and the cams carried thereon moving the slide mechanism in a reciprocating manner and out of phase with each other and with the die halves positioned so that one half is on one side of the guideway and the other half is on the other side of the guideway, the die halves providing shaping and trimming of the wire leads of the metered component, and, accumulating the shaped and trimmed components in one bin and the unwanted trimmed wire lead portions in another bin.

Terms such as "left", "right", "up", "down", "bottom", "top", "front", "back", "in", "out" and the like are applicable to the embodiment shown and described in conjunction with the drawings. These terms are merely for the purposes of description and do not necessarily apply to the position in which the shaping and trimming apparatus may be constructed or used.

While a particular embodiment of said apparatus is depicted and described it is to be understood that the invention is not limited thereto and protection is sought to the broadest extent the prior art allows.

What is claimed is:

1. Apparatus for feeding electrical components such as transistors having like bodies and having a plurality of wire leads extending from the base of the component, said leads aligned in a row from the base of the component, said apparatus including a feeding means whereat the components are selectively fed one at a time to a forming and trimming station where said leads are processed for use in a printed circuit board and the like, said apparatus including:

(a) a base and frame;

(b) a motor carried by said base, said motor having an infinitely variable speed output and carrying on an output shaft a sprocket means and a flexible drive means;

(c) a guideway of two spaced slide members having plate-like carrying surfaces disposed at a slope of about forty degrees and providing therewith a gravitational actuated means for supporting the bodies of advancing electrical components, said guideway providing a narrow slot through which wire leads of said component extend downwardly and provide a guide path for said components as they are advanced gravitationally, said slide members made with two thicknesses, a rigid thickness at said inlet and outlet ends and a thinner intermediate section therebetween, said thinner section sufficiently flexible to provide a shock absorber means to prevent undue pulling of said lead wires when formed and trimmed;

(d) a metering station for advancing only one component at a time, said station including first (upper) and second (lower) fingers spaced apart and reciprocated beneath said slide members, said fingers moved into and out of said path of and for said wire leads of the component, said first and second fingers reciprocated one hundred eighty degrees out of phase with each other so that when said second (lower) finger is in way of the leading edge of said wire lead for that component in the metering station, said first finger (upper) is positioned to enter the path above said trailing wire lead of that component in the metering station and as said first (upper) finger is moved into said path and engages said leading wire lead of that above component not yet in said metering station it engages and inhibits the advancement of said above component while that component in said metering station is released, said first and second fingers being alternately cycled to first inhibit then release a component;

(e) a first shaft carried by said base and rotated by said motor means through said flexible drive means, said first shaft carrying eccentric cams disposed to provide movement of said first and second fingers with an in-and-out movement and in an out-of-phase condition, said cams carried side by side on said first shaft with the axis of each disk offset from the axis of said shaft and with said cams disposed one hundred eighty degrees from each other;

(f) slide means retaining and carrying the fingers on members moved by said eccentric cams as carried on said first shaft, each of said fingers of metal, with said members disposed in slide-retaining means, with said member moved by the eccentric cams carried on the first shaft and with every full rotation of said shafts said cams are rotated a full revolution to achieve a forward-and-back reciprocation of the fingers by these cams;

(g) a pair of die halves removably mounted and mountable on support blocks, each block carried on an end of a slide member and combined to form a slide mechanism and disposed on reciprocably-guided mechanism and with said die pairs including movable half portions having determined shaping and trimming portions adapted to shape and trim leads of a component when brought therebetween, said reciprocably-guided mechanism including upper and lower members with support means so that one half of each die may be positioned opposite each other and opposite sides of that slide member intermediate section having the thinner thickness, each of said slide members connected to a rectangular cam follower configuration that slideably encloses a circular eccentric cam mounted on a shaft which moves said die slide mechanism;

(h) a second shaft carried by said base and rotated by said motor and said flexible drive means, said second shaft carrying eccentric cams arrayed side by side and moving the rectangularly configured cam followers and associated die halves in and out from said guideway and in an out-of-phase condition, and (i) means for accumulating said shaped and trimmed components in one bin and said unwanted wire lead portions in another bin.

2. Apparatus for feeding, shaping and trimming components as in claim 1 in which said base carries a support plate that is disposed at a slope substantially like said slope of said spaced members and said spaced members are carried and secured to two side plates with a bridge plate adjacent to and connecting said side plates.

3. Apparatus for feeding, shaping and trimming components as in claim 2 in which the motor is an electric motor and rotates a timing belt pulley mounted thereon and said pulley engaging and moving a timing belt and two other timing belt pulleys each of which move, said first shaft moving the metering members and the second shaft reciprocably moving the die moving slide mechanism.

4. Apparatus for feeding, shaping and trimming components as in claim 2 in which said slot for said wire leads is between forty and twenty thousandths of an inch apart and in said side members are formed through slots sufficiently wide and deep to allow free passage of the leads of an untrimmed and formed component.

5. Apparatus for feeding, shaping and trimming components as in claim 1 in which said eccentric cams are two circular disk-like cams carried side-by-side on the first shaft with the axis of each disk offset from the axis of said shaft and with said cams disposed one-hundred-eighty degrees from each other.

6. Apparatus for feeding, shaping and trimming components as in claim 5 in which peripheral surfaces of said rotated cams are wiped and oiled by a resilient wiper adapted and disposed to engage said peripheral surfaces of the cams.

7. Apparatus for feeding, shaping and trimming components as in claim 5 in which the output of the motor is a drive shaft then through a mated pair of bevel gears and to a short shaft which is the first shaft and is disposed to be parallel to the top slide surface of the guideway, and on this shaft said disk-like cams are mounted.

8. Apparatus for feeding, shaping and trimming components as in claim 1 in which said guideway is of two strips of metal coated at least on its outward surface so as to provide a slippery surface for the gravitational advancement of said component and its plastic body as it moves along said guideway.

9. Apparatus for feeding, shaping and trimming components as in claim 8 in which said strips of the guideway have their outer corners beveled to remove unwanted sharp corners and there is provided an entryway which is V-contoured to provide a diminishing entryway into said slot with said entryway adapted to align said wire leads and guide them into said slot.

10. Apparatus for feeding, shaping and trimming components as in claim 1 in which the means for selectively moving said die mechanism includes a pair of guide support rods disposed substantially normal to said top surface of said two spaced members and with said rods disposed to slideably engage bores formed in an extending support guide portion of said die support and with a lead screw carried and disposed to rotatably engage a threaded aperture in said support guide portion with at least one end of said lead screw rotatably secured to said base and frame so as to move die slide mechanism along said rods as said lead screw is rotated, said selective moving requiring cam followers that are each axially slideable along the second shaft to accommodate the movement of the die slide support.

11. Apparatus for feeding, shaping and trimming components as in claim 10 in which said lead screw is rotated by a lever attached at one end of said lead screw.

12. Apparatus for feeding, shaping and trimming components as in claim 10 in which an auxiliary tray is provided and attached to said reciprocably-guided mechanism so as to catch said trimmed wire leads and feed said trimmed portions to an accumulating bin.

13. Apparatus for feeding, shaping and trimming components as in claim 1 in which said rectangular configuration is assembled of and from portions that may be disassembled for repair and/or replacement.

14. Apparatus for feeding, shaping and trimming components as in claim 1 in which said mechanism is enclosed in a removable cover so as to prevent injury to an attendant and unwanted dust and dirt accumulation on and in said mechanism in the apparatus.

15. Apparatus for feeding, shaping and trimming components as in claim 1 in which said rigid thickness is metal of about one-eighth inch in thickness and said thinner portion is of metal of twenty to twenty-five thousandths of an inch in thickness.

16. Apparatus for feeding, shaping and trimming components as in claim 15 in which said spaced members are of sheet steel with a chrome plating to prevent rust, wear and promote slideability of said component bodies.

17. A method for feeding, to shaping and trimming operations electrical components such as transistors having like bodies and wire leads extending from a base portion of said components, said leads being aligned in a row, the method including the steps of:

(a) providing a base and frame for the apparatus;

(b) carrying an infinitely variable speed motor on said frame with an output shaft thereof carrying a sprocket by which a flexible drive means is advanced;

(c) positioning a narrow slot-type guideway through which said lead wires of the components extend, said guideway including two slide members and disposing said members at a slope of about forty degrees, thus providing a gravitationally actuated means for advancing said components on a bottom surface portion of said component, said slide members formed of metal and with each slide member having two thicknesses, the forming of each strip including a rigid thickness at the inlet and outlet ends and with a thinner intermediate section therebetween and positioning said thinner section in way of a die slide mechanism with said thinner section sufficiently flexible to provide a shock absorber for the support of said moved body and to prevent undue pulling of said lead wires when said while formed and trimmed by dies;

(d) placing a metering station in way of the guideway and reciprocating first and second fingers beneath the slide members, said fingers moved in and out of said guideway and with said fingers having a movement of one hundred eighty degrees out of phase with each other so that while said second finger is in way of a leading edge of said wire lead for that component in the metering station, said first finger positioned so as to enter said guideway above a trailing wire lead of that component in the metering station and as said second finger is moved into said guideway to engage said leading wire lead of the immediately above component not yet in the metering station, said second finger inhibiting the advancement of said component while said component in said metering station is released by said first finger, said first and second fingers being alternately cycled to first inhibit then release a component for advancement on said slide members;

(e) carrying a first shaft and rotating said shaft by said motor through a flexible drive means, said shaft carrying eccentric cams disposed to move said first and second fingers with an in-and-out movement and in an out-of-phase condition;

(f) retaining said carrying said fingers on slide members moved by said cams, said cams carried on the rotated shaft actuating said fingers, and forming each of said fingers of metal and disposing said members in slide-retaining means, with said members moved by the eccentric cams carried on the first shaft and with every full rotation of said first shaft said cams are rotated a full revolution to achieve a forward-and-back reciprocation of the fingers by these cams;

(g) removably mounting die halves on slide mechanism carried by said base and frame and moving said slide mechanism by cams carried on a shaft driven by said motor, said shaft and said cams carried thereon moving said slide mechanism in a reciprocating manner and out of phase with each other and with said die halves positioned so that one die half is on one side of said guideway and said other second die half is on the other side of said guideway, said die halves providing shaping and trimming of said wire leads of said metered component, and providing said die slide mechanism with mechanism by which said slide mechanism is movable toward and away from the top surface of said slide strips so as to shorten or lengthen the distance below the component body before shaping and trimming said leads of the component, and (h) accumulating said shaped and trimmed components in one bin and said unwanted trimmed wire lead portions in another bin.

18. A method for forming and trimming the leads of components as in claim 17 which further includes the steps of securing said fingers to individual slide guide members, each slide guide moved by a circular disk-like cam, each cam carried in a side-by-side array on said common shaft and with the axis of each disk offset from the axis of said shaft and with each cam disposed one hundred eighty degrees from the other.

19. A method for forming and trimming the leads of components as in claim 18 which further includes wiping said peripheral surfaces of said rotated cam by a wiper which is oiled.

20. A method for forming and trimming the leads of components as in claim 17 which further includes mounting said die halves on support blocks each for which are carried on said ends of a reciprocably-guided member and with each of said slide members having a rectangular enclosure that encases and is engaged by an eccentric cam mounted on a shaft that moves said die reciprocably-guided mechanism.

21. A method for forming and trimming the leads of components as in claim 20 which further includes providing and positioning a pair of guide support rods disposed substantially normal to the top surface of said guideway and with said rods disposed to slideably engage bores formed in an extending support guide portion of said die slide support and positioning and carrying a lead screw so as to rotatably engage a threaded aperture formed in said support guide and with one end of said lead screw rotatably secured to said base and frame so as to move said reciprocably-guided mechanism along said smooth rods as said lead screw is rotated.

22. A method for forming and trimming the leads of components as in claim 21 which further includes fastening a lever and knob to one end of said lead screw and selectively turning said lead screw by said lever and knob.

23. A method for forming and trimming the leads of components as in claim 17 which includes forming each of said guideway members of steel with a chrome plated surface and with said rigid thickness about one-eighth of an inch in thickness and with said thinner portion of about twenty to twenty-five thousandths of an inch in thickness.

24. A method for feeding, shaping and trimming the wire leads of electrical components as in claim 17 which further includes the step of forming the narrow slot in the guideway with a space therebetween of twenty- to forty-thousandths of an inch and in plate-like members supporting said guideway members forming through slots sufficiently wide and deep so as to allow free passage of leads of an untrimmed and formed electrical component.

* * * * *